(12) United States Patent
Byun et al.

(10) Patent No.: US 6,221,762 B1
(45) Date of Patent: Apr. 24, 2001

(54) METHOD FOR FABRICATING SEMICONDUCTOR DEVICE HAVING IMPROVED STEP COVERAGE AND LOW RESISTIVITY CONTACTS

(75) Inventors: Jeong Soo Byun; Byung Hak Lee, both of Chungcheongbuk-do (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 08/949,399

(22) Filed: Oct. 14, 1997

(30) Foreign Application Priority Data

Sep. 11, 1997 (KR) .................................. 97-46808
Sep. 29, 1997 (KR) .................................. 97-49798

(51) Int. Cl.⁷ .............................................. H01L 21/4763
(52) U.S. Cl. ................... 438/643; 438/647; 438/649; 438/655; 438/680; 438/683
(58) Field of Search ................................. 438/643, 655, 438/627, 535, 398, 365, 680, 683; 257/757, 72, 755, 754, 751, 750; 156/653

(56) References Cited

U.S. PATENT DOCUMENTS

| | | | |
|---|---|---|---|
| 4,359,490 | 11/1982 | Lehrer | 427/95 |
| 4,391,846 * | 7/1983 | Raymond | 427/255 |
| 4,443,930 | 4/1984 | Hwang et al. | 29/571 |
| 4,528,744 * | 7/1985 | Shibata | 29/571 |
| 4,551,908 * | 11/1985 | Nagasawa et al. | 29/571 |
| 4,656,157 | 4/1987 | Hofmann et al. | 502/439 |
| 4,684,542 | 8/1987 | Jasinski et al. | 437/245 |
| 4,701,349 * | 10/1987 | Koyanagi et al. | 427/228 |
| 4,766,006 | 8/1988 | Gaczi | 427/38 |
| 4,777,150 | 10/1988 | Deneuville et al. | 437/200 |
| 4,851,295 | 7/1989 | Brors | 428/450 |
| 4,920,908 | 5/1990 | Brors et al. | 427/255.2 |
| 4,940,509 * | 7/1990 | Tso et al. | 156/653 |
| 4,966,869 | 10/1990 | Hillman et al. | 437/200 |
| 4,971,655 * | 11/1990 | Stefano et al. | 156/659 |
| 4,977,098 * | 12/1990 | Yu et al. | 438/365 |
| 4,981,723 | 1/1991 | Hirase et al. | 427/255.2 |

(List continued on next page.)

FOREIGN PATENT DOCUMENTS

410032315 * 2/1998 (JP) .......................... H01L/27/108

OTHER PUBLICATIONS

Tohru Hara et al., "Tungsten Silicide Films Deposited by $SiH_2Cl_2$–$WF_6$ Chemical Reaction," J. Electrochem. Soc., vol. 136, No. 4, Apr. 1989, pp. 1117–1180.

Tohru Hara et al., "Composition of Tungsten Silicide Films Deposited by Dichlorosilane Reduction of Tungsten Hexafluoride," J. Electochem. Soc., vol. 137, No. 9, Sep. 1990, pp. 2955–2959.

J.T. Hillman et al., "Characterization of $WSi_x$ Films Depositied by Reacting WF6 with a Mixture of $SiH_2Cl_2$ and $Si_2H_6$," J. Electrochem. Soc., vol. 139, No. 12, Dec. 1997, pp. 3574–3578.

T.H. Tom Wu et al., "Properties of $WSi_x$ using dichlorosilane in a single–water system," J. Vac. Sci. Technol. B6(6), Nov./Dec. 1988, pp. 1707–1713.

S.G. Telford et al., "Chemically Vapor Deposited Tungsten Silicide Films Using Dichlorosilane in a Single–Water Reactor," vol. 140, No. 12, Dec. 1993, pp. 3689–3701.

*Primary Examiner*—Olik Chaudhuri
*Assistant Examiner*—Wai-Sing Lovie
(74) *Attorney, Agent, or Firm*—Fleshner & Kim, LLP

(57) ABSTRACT

A method for fabricating a semiconductor device improves step coverage and resistivity. The method includes the steps of forming a doped silicon layer on a substrate, forming a silicide layer containing more metal atoms than silicon atoms on the doped silicon layer, and heat treating in nitrogen to form a second silicide layer having a tetragonal phase crystal structure and a silicon nitride film on the top surface of the second silicide layer.

40 Claims, 7 Drawing Sheets

U.S. PATENT DOCUMENTS

| | | | |
|---|---|---|---|
| 5,084,416 | * 1/1992 | Ozaki et al. | 438/197 |
| 5,147,829 | 9/1992 | Hench et al. | 501/12 |
| 5,172,201 | * 12/1992 | Suizu | 257/303 |
| 5,231,056 | 7/1993 | Sandhu | 437/200 |
| 5,268,317 | 12/1993 | Schwalke et al. | 437/41 |
| 5,278,096 | 1/1994 | Lee et al. | 437/162 |
| 5,389,585 | * 2/1995 | Koenig et al. | 501/87 |
| 5,425,392 | 6/1995 | Thakur et al. | 437/173 |
| 5,500,249 | 3/1996 | Telford et al. | 427/255 |
| 5,525,543 | * 6/1996 | Chen | 438/643 |
| 5,536,684 | * 7/1996 | Dass et al. | 438/535 |
| 5,558,910 | 9/1996 | Telford et al. | 427/255 |
| 5,627,105 | * 5/1997 | Delfino et al. | 438/627 |
| 5,643,633 | 7/1997 | Telford et al. | 427/255 |
| 5,656,529 | * 8/1997 | Fukase | 438/398 |
| 5,747,845 | * 5/1998 | Iwasa | 257/306 |
| 5,771,110 | * 6/1998 | Hirano et al. | 257/72 |
| 5,830,775 | * 11/1998 | Maa et al. | 437/41 SM |
| 5,851,335 | * 11/1998 | Miyamoto | 257/757 |
| 5,851,921 | * 12/1998 | Gardner et al. | 438/655 |
| 5,851,922 | * 12/1998 | Bevk et al. | 438/655 |
| 6,069,060 | * 5/2000 | Matsumoto et al. | 438/486 |
| 6,074,925 | * 6/2000 | Aisou | 438/365 |

* cited by examiner

METHOD FOR FABRICATING SEMICONDUCTOR DEVICE HAVING IMPROVED STEP COVERAGE AND LOW RESISTIVITY CONTACTS

BACKGROUND OF THE INVENTION

1. Field of the Invention

The present invention relates to a semiconductor device, and more particularly, to a method for fabricating a semiconductor device, for improving a step coverage and a resistivity.

2. Discussion of the Related Art

In general, as the semiconductor devices are highly integrated, a width of wiring in the semiconductor devices is reduced, causing problems, such as drop in operation speed due to consequential increase of a resistance of the wiring. The formation of a thicker wiring as a wiring width is reduced used as a counter measure on the increased sheet resistivity of the wiring causes a problem that a fabrication process for the device becomes complicated with less yield because of a greater step coverage of the wiring. In order to solve these problems, a refractory metal silicide, such as tungsten silicide ($WSi_x$), titanium silicide($TiSi_2$), or cobalt silicide($CoSi_2$) is formed on a polysilicon layer for preventing an increase of resistivity. (hereafter, a refractory metal silicide formed on a polysilicon layer is called "polycide"). However, though this can improve the resistivity and step coverage to a certain extent, an improved method for forming a polycide further is need.

A conventional method for fabricating a semiconductor device will be explained with reference to the attached drawings. FIGS. 1A–1C illustrate process steps of a first conventional method for fabricating a semiconductor device, and FIGS. 2A–2C illustrate process steps of a second conventional method for fabricating a semiconductor device. A polycide fabrication process used for reducing a resistivity and a step coverage in a semiconductor device can be applied to a process for forming a gate electrode or a bitline.

The process steps of the first conventional method for fabricating a semiconductor device in which the polycide fabrication process is applied to formation of a gate electrode will be explained.

Referring to FIG. 1A, the process starts with deposition of a first oxide film 2 on a semiconductor substrate 1 and deposition of a polysilicon layer 3 on the first oxide film 2. The polysilicon layer 3 is doped with P type impurities and soluble in water. The doping of the polysilicon layer 3 may be done by ion injection after deposition of the polysilicon layer 3 is completed, or by deposition of $POCl_3$, or by a continuous injection of a doping gas, such as $PH_3$, while depositing the polysilicon layer. For removing a natural oxide film(or glass) which may remain on the polysilicon layer 3 during the process of forming the polysilicon 3, the process resultant is dipped into HF solution for cleaning. A chemical vapor deposition of $SiH_4$ or $SiH_2Cl_2$ with tungsten hexafluoride($WF_6$) gas is conducted to form a tungsten silicide layer 4, to form a polycide layer. As shown in FIG. 1C, the tungsten silicide layer 4, polysilicon layer 3 and the first oxide film 2 are subjected to photolithography to make an anisotropic etching of the layers 2, 3 and 4 with a mask for forming a gate electrode used, resulting to form a stack of a gate cap silicide layer 4a, a gate electrode 3a and a gate oxide film 2a. A lightly doped drain(LDD) region 5 is formed in the semiconductor substrate 1 on each side of the gate electrode 3a. A second oxide film is deposited on the entire surface and subjected to anisotropic etching to remove the second oxide film, forming sidewall insulating films 6 on both sides of the gate cap silicide layer 4a, gate electrode 3a and gate oxide film 2a. Portions of the semiconductor substrate 1 on outward sides of the sidewall insulating films 6, excluding a portion under the gate electrode 3a, are heavily doped, to form source/drain regions 7 therein.

The process steps of the second conventional method for fabricating a semiconductor device in which the polycide fabrication process is applied to formation of a bitline will be explained.

Referring to FIG. 2A, the process steps start with formation of an N type impurity doped layer 8 in a portion of a P type semiconductor substrate 1. A chemical vapor deposition is conducted to form an interlayer insulating layer 9 on the semiconductor substrate 1, which is selectively removed to form a contact hole 10 exposing the N type impurity doped layer 8. As shown in FIG. 2B, a polysilicon layer 11 is formed on the entire surface. The polysilicon layer 11 is doped with P type impurities and soluble in water. The doping of the polysilicon layer 11 may be done by ion injection after deposition of the polysilicon layer 3 is completed, or by deposition of $POCl_3$, or by a continuous injection of a doping gas, such as $PH_3$, while depositing the polysilicon layer. For removing a natural oxide film.(or glass) which may remain on the polysilicon layer 11 during the process of forming the polysilicon 11, the process resultant is dipped into HF solution for cleaning. A chemical vapor deposition of $SiH_4$ or $SiH_2Cl_2$ with tungsten hexafluoride($WF_6$) gas is conducted to form a tungsten silicide layer 12 on the polysilicon layer 11, which is subjected to selective patterning to form a bitline of the polycide layer, as shown in FIG. 2C.

In the conventional polycide fabrication process, a doped polysilicon layer is formed on a substrate, and the polysilicon layer is cleaned with HF solution to remove a natural oxide film present on the surface of the polysilicon layer, which is then placed in a chamber and maintained at an elevated temperature over 500 deg. C. while injecting $SiH_4$ or $SiH_2Cl_2$, and $WF_6$ gases into the chamber, to form tungsten silicide(WSix) on the doped polysilicon layer. In comparison to a tungsten silicide(WSix) with $2<x\leq 3.2$, the aforementioned tungsten silicide contains an excessive amount of silicon. If the tungsten silicide containing excessive amount of silicon is subjected to heat treatment, a resistivity of the tungsten silicide is lowered compared to the case when the tungsten silicide is not formed, resulting in an improvement in operational characteristics of the device.

However, the conventional method for fabricating a semiconductor device has various problems.

For example, the cleaning of the doped polysilicon with HF solution for removing the natural oxide film present on the surface of the doped polysilicon causes to leave an undoped polysilicon layer on the surface of the doped polysilicon layer. The formation of tungsten silicide on the doped polysilicon layer with an undoped polysilicon surface leads to formation of a tungsten silicide with an excessive amount of silicon, which has a resistivity higher than 100 $\mu\Omega\cdot cm$ even after heat treatment. Although the tungsten silicide layer lowers the resistivity of the polysilicon layer which has a resistivity of 200 $\mu\Omega\cdot cm$, by approximately half, that is not enough for a highly integrated device in which a line width is no greater than 0.25 $\mu m$.

Further, a bitline formed with a tungsten silicide layer formed by $SiH_4$ or $SiH_2Cl_2$ according to the second conventional method has a step coverage greater than a bitline formed with a tungsten metal layer. Due to this, a problem is caused that the bitline can not fully fill a contact hole in a device fabrication process which involves a contact hole size no greater then 0.25 µm with an aspect ratio greater than 3 as shown in FIG. 2C.

SUMMARY OF THE INVENTION

Accordingly, the present invention is directed to a method for fabricating a semiconductor device that substantially obviates one or more of the problems due to limitations and disadvantages of the related art.

An object of the present invention is to provide a method of forming a metal silicide for improving a step coverage and resistivity, and a method for fabricating a semiconductor device applying the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a semiconductor device includes the steps of forming an insulating layer on a semiconductor substrate, forming a doped silicon layer on the insulating layer, and forming a silicide layer containing an excessive amount of metal on the doped silicon layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate preferred embodiments of the invention and together with the description serve to explain the principles of the invention.

DETAILED DESCRIPTION OF THE PREFERRED EMBODIMENT

Figure 1A:
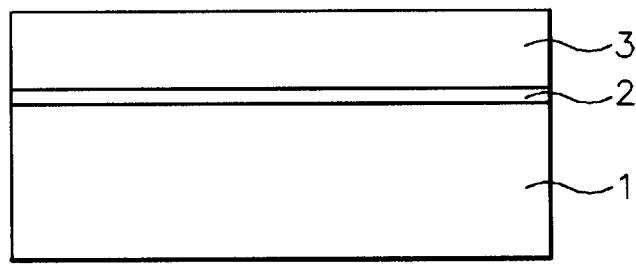
FIGS. 1A–1C illustrate process steps of a first conventional method for fabricating a semiconductor device.
Figure 1B:
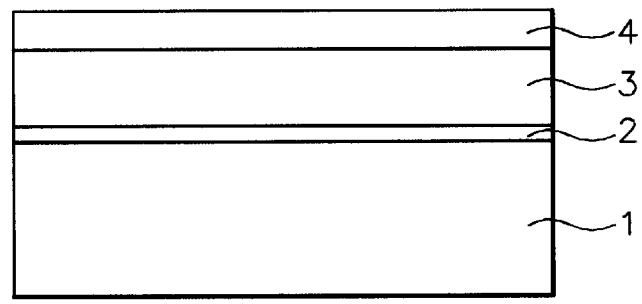
Figure 1C:
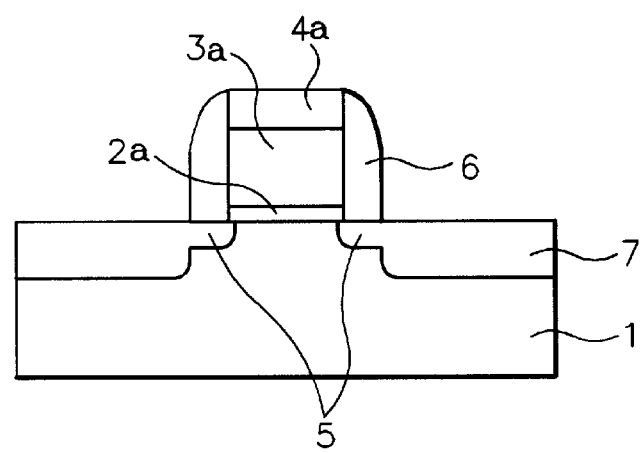
Figure 2A:
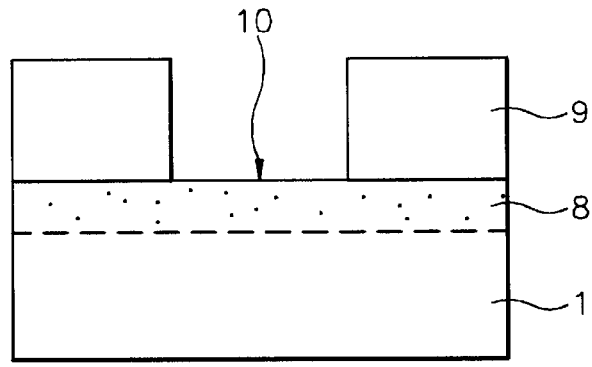
FIGS. 2A–2C illustrate process steps of a second conventional method for fabricating a semiconductor device.
Figure 2B:
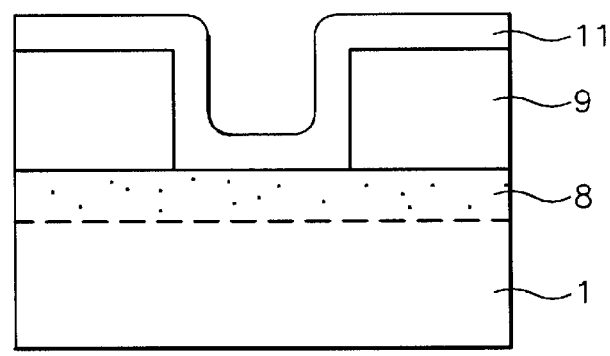
Figure 2C:
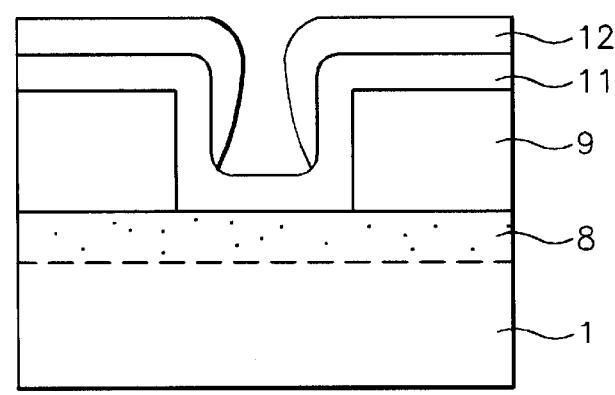
Figure 3A:
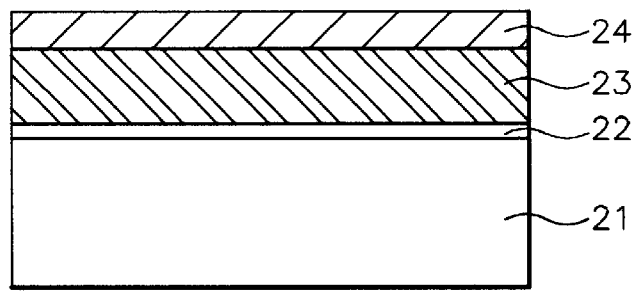
FIGS. 3A–3C illustrate sections steps of a method for fabricating a semiconductor device in accordance with a first preferred embodiment of the present invention.
Figure 3B:
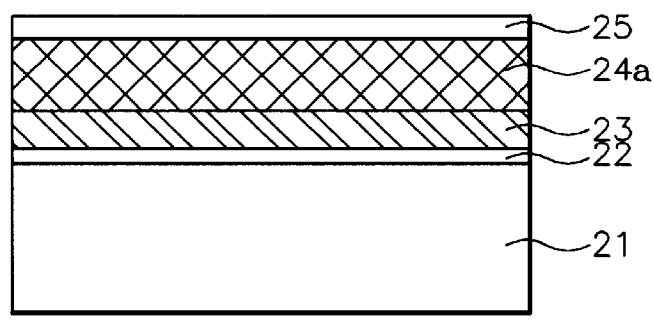
Figure 3C:
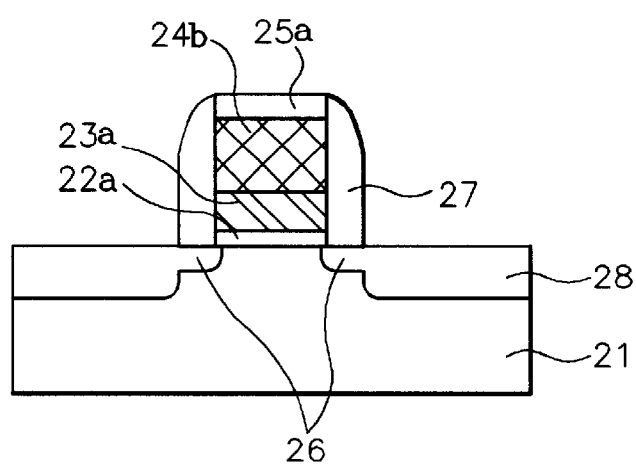

Reference will now be made in detail to the preferred embodiments of the present invention, examples of which are illustrated in the accompanying drawings. FIGS. 3A–3C illustrate process steps of a method for fabricating a semiconductor device in accordance with a first preferred embodiment of the present invention, and FIGS. 4A–4D illustrate process steps of a method for fabricating a semiconductor device in accordance with a second preferred embodiment of the present invention. The polycide fabricating process used for reducing a resistivity of a semiconductor device is applicable to formation of a gate electrode and a bitline.

Referring to FIG. 3A, the method for fabricating a semiconductor device in accordance with a first preferred embodiment of the present invention starts with depositing a first oxide film 22 on a semiconductor substrate 21 to a thickness of 80 Å. An ICT(Integrated Cluster Tool) is used for forming a doped polysilicon layer 23 to a thickness of 1000 Å at 660 deg. C. and 80 Torr. The polysilicon layer 23 is deposited using a source gas of $H_2$ containing 50% of $SiH_4$ and 1% of $PH_3$. The semiconductor substrate 21 with the doped polysilicon layer 23 deposited thereon is transferred to a chamber for use in depositing a first tungsten silicide layer 24 without exposure to the atmosphere(i.e., without breakage of a vacuum). Then, the first tungsten silicide layer 24 is deposited on the polysilicon layer 23. The first tungsten silicide layer 24 is deposited using $WF_6$ and $SiH_4$ or $SiH_2Cl_2$ and $WF_6$ gases as source gases. If $WF_6$ and $SiH_4$ are used, the flow rates are 4 and 175 sccm respectively, and the deposition pressure is fixed at 0.9 Torr while varying deposition temperature in a range of 500~600 deg. C., resulting to deposit a tungsten silicide layer containing an excessive amount of tungsten. That is, a tungsten silicide layer satisfying a condition of $0.5<x\leq2$ in WSix is deposited. If the first tungsten silicide layer 24 is deposited at a temperature below 555 deg. C., the first tungsten silicide layer 24 is converted into amorphous, and if the first tungsten silicide layer 24 is deposited at a temperature above 555 deg. C., the first tungsten silicide layer 24 has amorphous phases and crystalline phases existing together. Because the doped polysilicon layer 23 is not exposed to the atmosphere during formation of the first tungsten silicide layer 24, that eliminates the conventional requirement for cleaning with HF solution for removing the natural oxide film, no undoped layer is formed on the surface of the doped polysilicon layer, causing the first tungsten silicide layer 24 to contain more tungsten atoms than silicon atoms. As shown in FIG. 3B, RTA(Rapid Thermal Annealing) is conducted at a temperature in a range of 400~1100 deg. C.(most preferably 900~1000 deg. C.) for 30 seconds under a gaseous ambient containing nitrogen atoms, such as nitrogen ($N_2$), argon(Ar), or $NH_3$. In this instance, the excessive tungsten atoms in the first tungsten silicide 24 and the doped polysilicon layer 23 react with each other leading to a formation of a second tungsten silicide layer 24a having a tetragonal phase crystal structure. The second tungsten silicide layer 24a has a tetragonal phase crystal structure which has a lower resistivity than the resistivity of the conventional heat treated silicon excess tungsten silicide. The silicon nitride film 25 formed on the surface of the second tungsten silicide layer 24a in the process of the heat treatment of the first tungsten silicide layer 24 under a gaseous ambient containing nitrogen atoms, not only prevents diffusion of N type or P type dopant, but also can be used as a protection film. As shown in FIG. 3C, a mask for forming a gate electrode is used in an anisotropic etching of the second tungsten silicide layer 24a, the polysilicon layer 23 and the first oxide film 22, to form a gate cap silicide layer 24b, a gate electrode 23a, and a gate oxide film 22a. LDD(Lightly Doped Drain) regions 26 are formed in the semiconductor substrate 21 on both sides of the gate electrode 23a, and a second oxide film is formed on the entire surface and subjected to anisotropic etching to remove the second oxide film, to form sidewall insulating films 27 at sides of the gate cap nitride film 25a, the gate cap tungsten silicide film 24b, the gate electrode 23a and the gate oxide film 22a. Then, portions of the semiconductor substrate 21 on both sides of the sidewall insulating films 27 excluding the gate electrode 23a are heavily doped to form source/drain regions 28 therein.

Next, a method for fabricating a semiconductor device in accordance with a second embodiment of the present invention as applied to bitline formation will be explained.

Figure 4A:
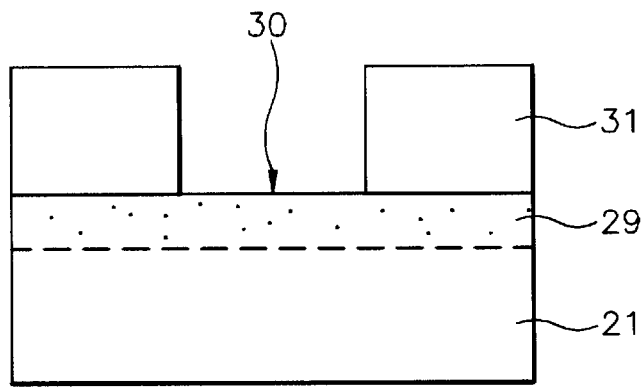
FIGS. 4A–4D illustrate sections steps of a method for fabricating a semiconductor device in accordance with a second preferred embodiment of the present invention.
Figure 4B:
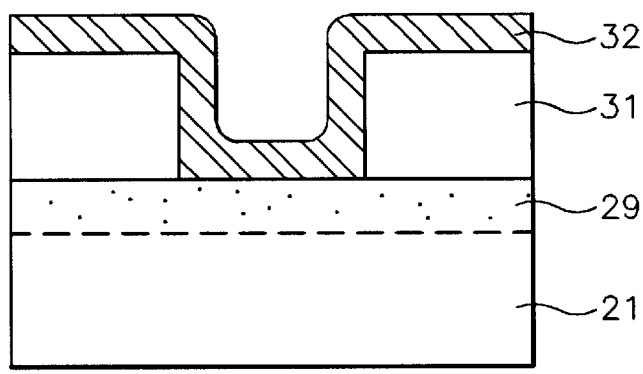
Figure 4C:
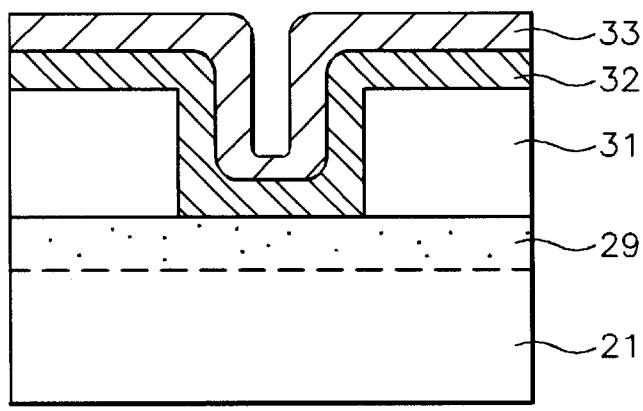
Figure 4D:
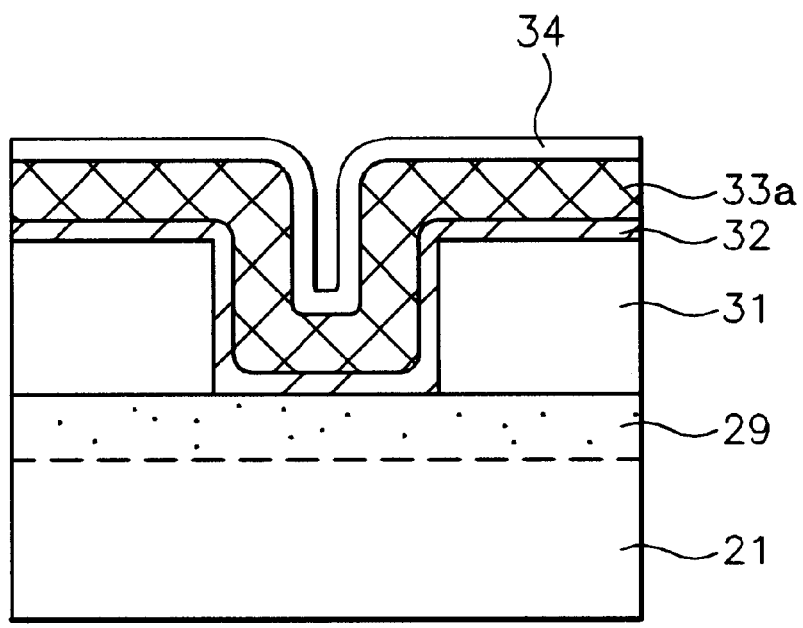

Referring to FIG. 4A, N type impurity ions are injected into a P type semiconductor substrate 21 to form an N type impurity injected layer 29 in a certain portion of the P type semiconductor substrate 21. An interlayer insulating layer 31 of a nitride film or oxide film is deposited on the entire surface and subjected to anisotropic etching to expose the N type impurity injected layer 29, to form a contact hole 30 on the N type impurity injected layer 29. As shown in FIG. 4b, a polysilicon layer 32 is deposited on the surface in the contact hole 30 and on the interlayer insulating layer 31. In this instance, the polysilicon layer 32 is deposited using a source gas of $H_2$ containing 50% $SiH_4$ and 1% $PH_3$. As shown in FIG. 4C, the semiconductor substrate 21 with the doped polysilicon layer 32 deposited thereon is transferred to a chamber for use in depositing a first tungsten silicide layer 33 without exposure to the atmosphere. The first tungsten silicide layer 33 is deposited on the polysilicon layer 32. As explained in association with FIG. 3A, the first tungsten silicide layer 33 is deposited using $WF_6$ and $SiH_4$ or $SiH_2Cl_2$ and $WF_6$ gases as source gases. If $WF_6$ and $SiH_4$ are used, the flow rates are 4 and 175 sccm respectively, and the deposition pressure is fixed at 0.9 Torr while varying deposition temperature in a range of 500~600 deg. C., resulting to deposit a tungsten silicide layer containing an excessive amount of tungsten. A tungsten silicide layer satisfying a condition of $0.5 \leq x<2$ in $WSi_x$ is deposited. If the first tungsten silicide layer 33 is deposited at a temperature below 555 deg. C, the first tungsten silicide layer 33 is converted into amorphous, and if the first tungsten silicide layer 33 is deposited at a temperature above 555 deg. C., the first tungsten silicide layer 33 has amorphous phases and crystalline phases existing together. Because the doped polysilicon layer 32 is not exposed to the atmosphere during formation of the first tungsten silicide layer 33, that eliminates the conventional requirement for cleaning with HF solution for removing the natural oxide film, no undoped layer is formed on the surface of the doped polysilicon layer, causing the first tungsten silicide layer 33 to contain more tungsten atoms than silicon atoms. As shown in FIG. 4D, RTA(Rapid Thermal Annealing) is conducted at a temperature in a range of 400~1100 deg. C.(most preferably 900~1000 deg. C.) for 30 seconds under a gaseous ambient containing nitrogen atoms, such as nitrogen($N_2$), argon(Ar), or $NH_3$. In this instance, the excessive tungsten atoms in the first tungsten silicide layer 33 and the doped polysilicon layer 32 react each other leading to a formation of a second tungsten silicide layer 33a having a tetragonal phase crystal structure. The second tungsten silicide layer 33a has a tetragonal phase crystal which, has a lower resistivity than the resistivity of the conventional heat treated silicon excess tungsten silicide. The second tungsten silicide layer 33a has a grain size greater than a grain size of the conventional tungsten silicide layer. When the first tungsten silicide layer 33 is heat treated in a gaseous ambient containing nitrogen atoms, as the grain size thus becomes greater, the silicon atoms existing in the first tungsten silicide layer 33 are segregated to the surface of the first tungsten silicide layer 33, to form a silicon nitride film 34 on the surface of the second tungsten silicide layer 33a, consuming the polysilicon layer 32 to reduce the thickness. The silicon nitride film 34 prevents the N type or P type dopant in the polysilicon layer 32 from being diffused. The first tungsten silicide layer 33 may be injected with ions before the RTA process, to convert the first tungsten silicide layer 33 into an amorphous layer. That is, as the first tungsten silicide layer 33 has a crystalline layer on an amorphous layer, ions of phosphorus (P), boron(B), or arsenic(As) are injected into the crystalline layer to a dose of 1E15~5E15 $cm^{-2}$ at an injection energy of 45~55 KeV in case of phosphorus(P), of 10~20 KeV in case of boron(B), and of 55~65 KeV in case of arsenic(As).

The second tungsten silicide layer 33a of the present invention is better than the conventional tungsten silicide ($WSi_2$) layer which is formed by heat treating a tungsten in that the second tungsten silicide layer 33a of the present invention has no possibility of defect occurrence during fabrication coming from excessive reaction of the silicon atoms present on the semiconductor substrate 21 before formation of the second tungsten silicide layer 33a with the semiconductor substrate 21 during the heat treatment. Thus, the method for fabricating a semiconductor device in accordance with the second embodiment of the present invention is completed.

Figure 5:
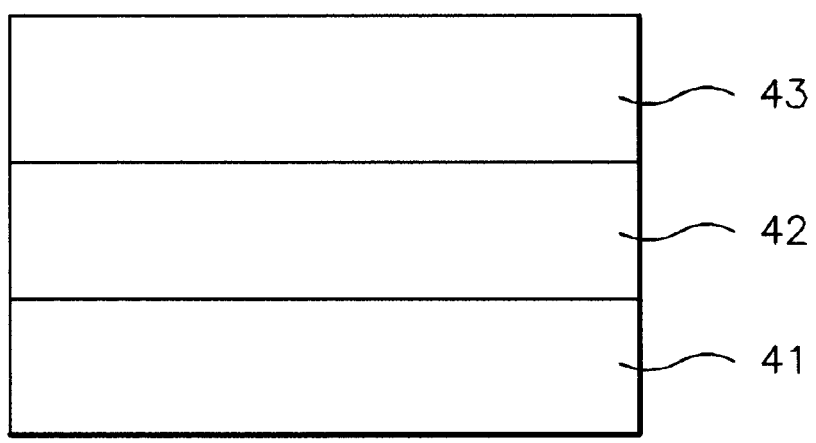
FIG. 5 illustrates a method for forming a metal silicide in accordance with a third preferred embodiment of the present invention.

In the third embodiment of the present invention, a silicon layer is formed on upper and under sides of a metal silicide layer in a method for forming a gate electrode or a data line. FIG. 5 illustrates a section showing a method for forming a metal silicide in accordance with a third preferred embodiment of the present invention.

An ICT(Integrated Cluster Tool) is used in formation of a first polysilicon layer 41 at 660 deg. C. and 80 Torr to a thickness of 1000 Å and the first polysilicon layer 41 is doped. Or, alternatively, the doped polysilicon layer 41 may be obtained by depositing a polysilicon layer using a source gas of $H_2$ containing 50% $SiH_4$ and 1% $PH_3$. The substrate having the first polysilicon deposited thereon is transferred to a chamber for use in deposition of a first tungsten silicide layer 42 without exposure to the atmosphere(i.e., without breakage of a vacuum), and then, the first tungsten silicide layer 42 is formed on the doped first polysilicon layer 41. In this instance, the first tungsten silicide layer 42, which can be formed according to a method identical to the first or second embodiment methods, is amorphous or amorphous and crystalline existing together and contains excessive tungsten. And, a second polysilicon layer 43 is formed on the first tungsten silicide layer 42 to a thickness of 0.05~0.4 times of the tungsten silicide layer 42, and subjected to RTA(Rapid Thermal Annealing) at a temperature ranging 400~1100 deg. C. for 30 seconds, causing reaction between the excessive tungsten atoms in the first tungsten silicide layer 42 and the doped first and second polysilicon layers 41 and 43 leading to form a second tungsten silicide layer of tetragonal phase. This tetragonal phase second tungsten silicide layer shows, not only a lower resistivity than the conventional one, but also better properties than ones formed by the first and second embodiments. That is, the diffusion of silicon atoms from the underlying polysilicon layer to the overlying first tungsten silicide layer during the heat treatment in the first and second embodiments, causing grain sizes in the first tungsten silicide layer to become greater, may make the second tungsten silicide layer bent. However, in the third embodiment, as the silicon atoms are fed to the first tungsten silicide layer from all of the first, and second polysilicon layers during the heat treatment, there is no possibility of bent. Alike the first, and second embodiments, metals and dopants may also be varied in this third embodiment.

Figure 6:
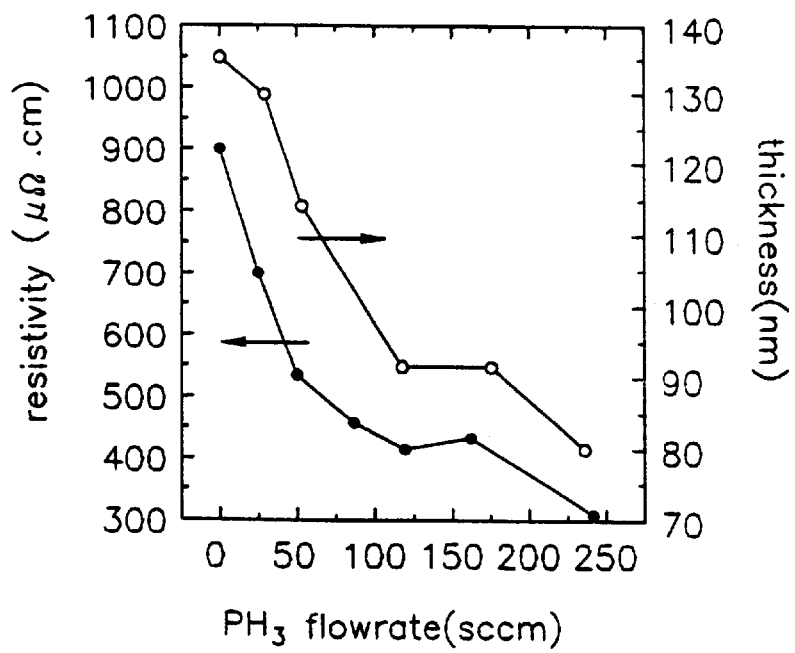
FIG. 6 illustrates a graph showing a $PH_3$ flow rate vs. a resistivity of a tungsten silicide layer(WSix) in deposition of a polysilicon layer according to the method for fabricating a semiconductor device of the present invention.
Figure 7:
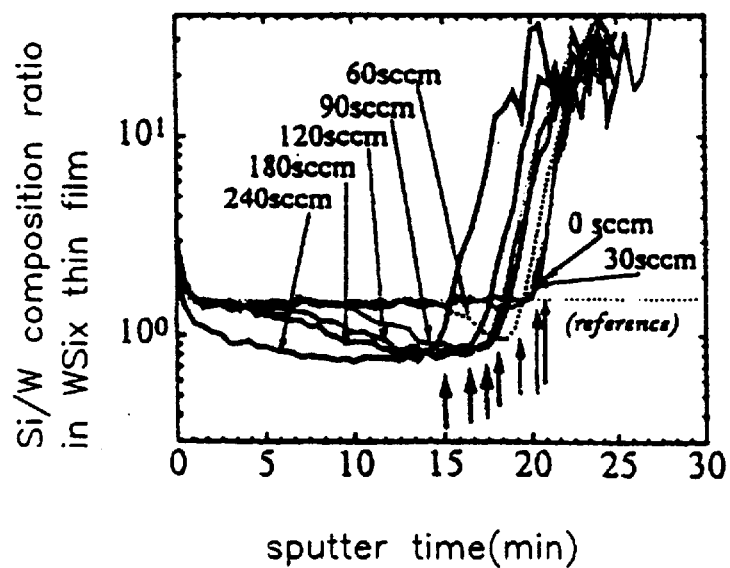
FIG. 7 illustrates a graph showing a sputtering time vs. a silicon atoms/tungsten atoms ratio in a tungsten silicide layer(WSix) for different $PH_3$ flow rates in deposition of a polysilicon layer according to the present invention.
Figure 8:
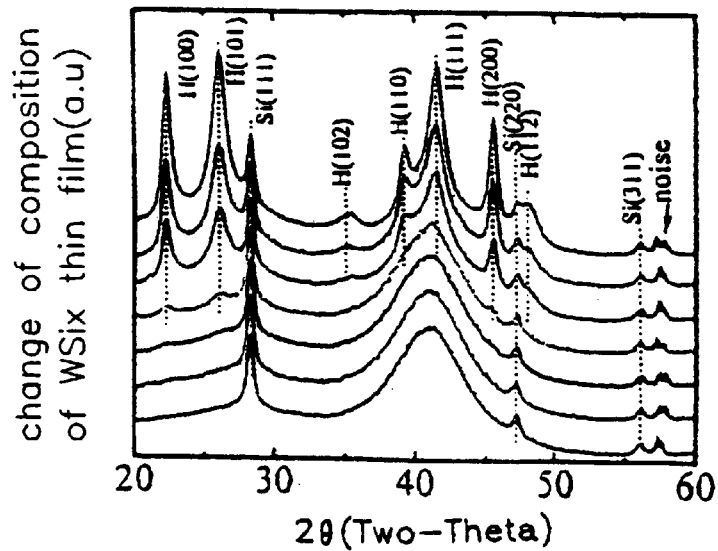
FIG. 8 illustrates a graph showing a deposition temperature of a tungsten silicide layer (WSix) vs. a composition of the tungsten silicide layer of the present invention.
Figure 9:
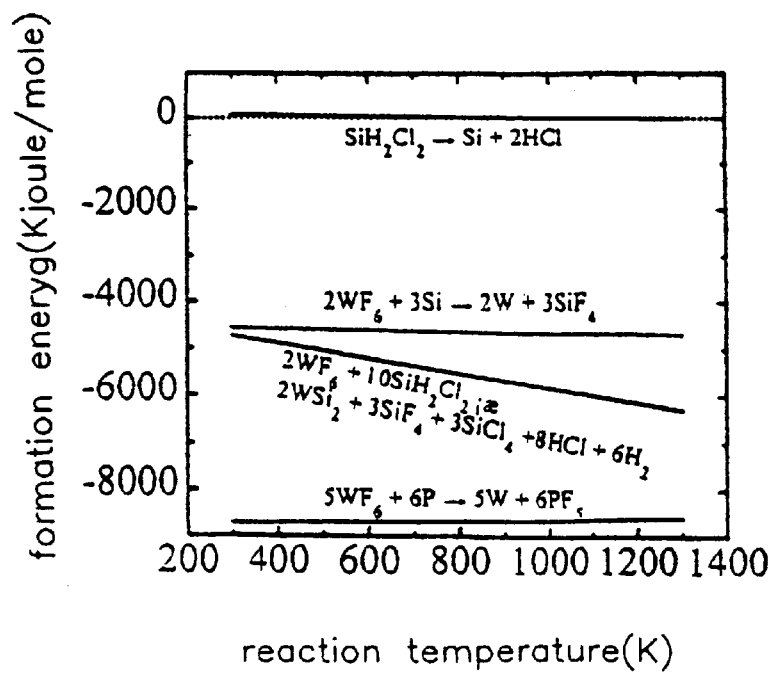
FIG. 9 illustrates a graph showing a reaction temperature of a tungsten silicide layer formed according to different source gases injected into a doped polysilicon layer of the present invention vs. formation energy.

Analysis data on test results of the semiconductor device of the present invention formed according to the aforementioned methods will be explained with reference to the attached drawings. FIG. 6 illustrates a graph showing $PH_3$ flow rate vs. resistivity of a tungsten silicide layer(WSix) in deposition of a polysilicon layer according to the method for fabricating a semiconductor device of the present invention, FIG. 7 illustrates a graph showing a sputtering time vs. a silicon atoms/tungsten atoms ratio in a tungsten silicide layer(WSix) for different $PH_3$ flow rates in deposition of a polysilicon layer according to the present invention, FIG. 8 illustrates a graph showing a deposition temperature of a tungsten silicide layer (WSix) vs. a composition of the tungsten silicide layer of the present invention, and FIG. 9 illustrates a graph showing a reaction temperature of a tungsten silicide layer formed according to different source gases injected into a doped polysilicon layer of the present invention vs. formation energy.

First, changes in resistivity and thickness of a tungsten silicide layer according to a change of a flow rate of $PH_3$ gas in deposition of a polysilicon layer will be discussed.

Referring to FIG. 6, in doping the polysilicon layer, as a concentration of phosphorus(P) is increased, i.e., the $PH_3$ flow rate is increased, a thickness of the tungsten silicide layer(i.e., a deposition rate) is decreased and the resistivity of the tungsten silicide layer is substantially lowered compared to a conventional case. For example, the resistivity is 905 $\mu\Omega\cdot cm$ when no $PH_3$ gas presents, and the resistivities are 412 $\mu\Omega\cdot cm$ and 310 $\mu\Omega\cdot cm$ when the $PH_3$ flow rates are 120 sccm and 240 sccm, respectively.

Next, a change in a composition ratio of silicon atoms vs. tungsten atoms according to a change of a $PH_3$ flow rate in deposition of the polysilicon layer will be discussed. A result of an AES(Auger Electron Spectroscopy) analysis of the conditions in which a tungsten excess tungsten silicide (WSix) layer is formed at an interface between a doped polysilicon layer and a tungsten silicide layer in formation of the tungsten silicide layer by depositing tungsten on the doped polysilicon layer will be explained.

Referring to FIG. 7, as $PH_3$ is added to a polysilicon layer, increasing a dopant concentration in the polysilicon layer, a tungsten excess layer was appeared at an interface between the tungsten silicide layer and the polysilicon layer; a tungsten silicide layer containing the more tungsten atoms is formed when the $PH_3$ flow rate is the lower if the sputter durations are the same. For example, the tungsten silicide layer contains more tungsten atoms when the $PH_3$ flow rate is 60 sccm than 240 sccm. The composition ratio of silicon atoms to tungsten atoms right after deposition of the tungsten silicide layer is made to be 0.5~2.

A composition change of a tungsten silicide layer according to a deposition temperature change of the tungsten silicide layer will be discussed. FIG. 8 illustrates an XRD (X-ray diffraction) analysis result of tungsten silicide layers (WSix) deposited at different temperatures while other conditions was kept the same.

Referring to FIG. 8, when the tungsten silicide layers were deposited at different temperatures of 510 deg. C., 525 deg. C., 540 deg. C., 555 deg. C., 570 deg. C., 585 deg. C. and 600 deg. C. respectively, the tungsten silicide layers deposited at temperatures below 555 deg. C. were at amorphous phase and the tungsten silicide layers deposited at temperatures above 555 deg. C. were at a phase in which amorphous and crystalline tungsten silicides exist together. And, from the fact that X-rays appear intensive when 2Θ(angle) of the tungsten silicide layer are 30 deg. and approx. 40 deg., it can be known that the X-rays are diffracted at those angles where the tungsten silicide layer has a crystal orientation of (111).

Further, the reason why the tungsten silicide layer of the present invention has better resistivity and step coverage will be explained in thermodynamic point of view with reference to FIG. 9. FIG. 9 illustrates a reaction temperature vs. a formation energy(ΔG) in case a tungsten silicide layer is formed by a reaction of a doped polysilicon layer with $WF_6$ gas and $SiH_2Cl_2$ gas.

A reaction equation of $WF_6$ gas and P ions to form tungsten(W) and $PF_5$ is as shown below.

$$5WF_6 + 6P \rightarrow 5W + 6PF_5 \qquad (1)$$

And, a reaction equation in formation of the tungsten silicide layer(WSi$_2$) is as shown below.

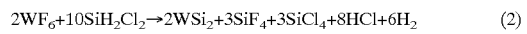

$$2WF_6 + 10SiH_2Cl_2 \rightarrow 2WSi_2 + 3SiF_4 + 3SiCl_4 + 8HCl + 6H_2 \qquad (2)$$

In the method for forming a tungsten silicide of the present invention, since the reaction (equation 1) of forming tungsten and $PF_5$ takes place before the reaction(equation 2) of forming the tungsten silicide, the tungsten excess tungsten silicide layer(WSix) is formed at the end. In this instance, formation enthalpies(ΔHf) of $WSi_2$, $PF_5$ and $WF_6$ are −31.0, −265.73 and 62.48 [kJ/gram.atom], respectively. Because the formation enthalpy of $PF_5$ is substantially stable compared to that of $WSi_2$ or $WF_6$, $PF_5$ is produced in advance. And, as a result of the experiment, it is also found that tungsten is also formed from a reaction caused by phosphorus atoms(P) in the natural oxide film($P_2O_5$) produced on the surface of the doped polysilicon layer when the doped polysilicon layer is exposed to the atmosphere, that is one reason of the tungsten excess tungsten silicide layer formation. The tungsten excess tungsten silicide layer is also formed in a process which involves a polysilicon layer doped with boron(B) or arsenic(As); $BF_3$ and $AsF_3$ are produced on the polysilicon layer doped with boron(B) or arsenic(As) as reaction by-products, of which formation enthalpies being −279.97 and −196.44 [kJ/gram.atom], respectively. Because tungsten is produced before the tungsten silicide layer by the formation enthalpies, the tungsten excess tungsten silicide layer is formed. And, according to such a thermodynamic principle, a polycide layer can also be formed even using titanium(Ti) or tantalum(Ta) besides tungsten. In case of titanium, $TiSi_2$ can be formed using $TiCl_4$, $TiI_2$, $SiH_4$, $SiH_2Cl_2$ or the like as a source gas, and, in case of tantalum, $TaSi_2$ can be formed using $TaCl_5$, $SiH_4$, $SiH_2Cl_2$ or the like as a source gas.

The method for forming a semiconductor device of the present invention as explained has the following advantages.

First, the tungsten excess tungsten silicide layer and the silicon nitride film formed in the heat treatment process (especially, in a RTA in an $NH_3$ ambient) after formation of the tungsten silicide layer reduces a resistivity of the tungsten silicide layer, which subsequently improves device performance.

Second, the doping of the polysilicon layer with phosphorus(P), boron(B), or arsenic(As), which have great formation energies, causes tungsten produced in advance in formation of a tungsten silicide layer on the polysilicon layer due to their thermodynamical properties. Because of this, a tungsten excess tungsten silicide layer is formed, which leads to increase a thickness of the tungsten silicide layer stuffed in a contact hole as much as the device packing density becomes greater, that improves a step coverage.

Third, in the case when polysilicon layers are formed on upper and under sides of the tungsten silicide layer, a tungsten silicide layer that is more flat can be obtained, and, diffusion of impurities, such as oxygen, into inner portion of the tungsten silicide layer can be prevented completely during conservation in the atmosphere before heat treatment after deposition of the second polysilicon, that allows conservation of the tungsten silicide layer properties.

It will be apparent to those skilled in the art that various modifications and variations can be made in the method for fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising:
   forming an insulating layer on a substrate;
   forming a contact hole in the insulating layer to expose a portion of the substrate;
   forming a doped semiconductor layer on the exposed portion of the substrate and in the contact hole;
   forming a silicide layer having metal and semiconductor atoms over the doped semiconductor layer by chemical vapor deposition; and
   heat treating the silicide layer and the doped semiconductor layer in a gaseous ambient containing nitrogen atoms to cause the silicide layer to react with the doped semiconductor layer to form a second silicide layer having a tetragonal phase crystal structure, and wherein the heat treatment results in the formation of a silicon nitride film on the top surface of the second silicide layer.

2. The method of claim 1, wherein the doped semiconductor layer is doped silicon layer and dopant of the doped semiconductor layer is one of boron (B), phosphorus (P), and arsenic (As).

3. The method of claim 2, wherein the doped semiconductor layer is formed using a source gas containing $SiH_4$ and $PH_3$ when the doped semiconductor layer is a doped silicon layer and the dopant of the doped silicon layer is phosphorous (P).

4. The method of claim 1, wherein the silicide layer contains more metal atoms than semiconductor atoms and the metal atoms are one of tungsten (W), titanium (Ti), and tantalum (Ta).

5. The method of claim 4, wherein the doped semiconductor layer is a doped silicon layer and $WF_6$ and $SiH_4$ or $WF_6$ and $SiH_2Cl_2$ are used as source gases for forming the silicide layer.

6. The method of claim 4, wherein the doped semiconductor layer is a doped silicon layer, and $TiCl_4$ or $TiI_2$ and $SiH_4$ or $SiH_2Cl_2$ are used as source gases for forming the silicide layer.

7. The method of claim 4, wherein the doped semiconductor layer is a doped silicon layer and $TaCl_5$ and $SiH_4$ or $SiH_2Cl_2$ are used as source gases for forming the silicide layer.

8. The method of claim 1, wherein the heat treatment is conducted at a temperature in a range of about 400 deg. C.~1100 deg. C.

9. The method of claim 1, wherein the silicide layer is formed such that it is amorphous.

10. The method of claim 9, wherein the silicide layer is formed by depositing a silicide layer at a temperature below about 555 deg. C. for making an amorphous silicide layer.

11. The method of claim 1, wherein the silicide layer is formed on the doped semiconductor layer without exposing the semiconductor layer to the atmosphere.

12. The method of claim 1, wherein the doped semiconductor layer comprises a polysilicon layer.

13. The method of claim 1, wherein the doped semiconductor layer is a doped silicon layer and the silicide layer is formed such that a ratio of metal atoms (M) to silicon atoms (Si) satisfies a condition of about $0.5 \leq x < 1$ in the formula $MSi_x$.

14. The method of claim 1, wherein the doped semiconductor layer is a doped silicon layer and a dopant of the doped silicon layer is one of boron (B) and arsenic (As).

15. The method of claim 1, wherein the metal atoms are one of tungsten (W) and tantalum (Ta).

16. The method of claim 8, wherein the heat treatment is conducted at a temperature of about 601 deg. C. to about 1100 deg. C.

17. The method of claim 1, wherein the doped semiconductor layer is formed with an integrated cluster tool.

18. A method for fabricating a semiconductor device, comprising the steps of:
   forming a doped silicon layer;
   forming a metal silicide layer containing more metal atoms than silicon atoms on the doped silicon layer by chemical vapor deposition; and,
   heat treating the silicon layer and the metal silicide layer in a nitrogen atmosphere to form a silicon nitride film over the metal silicide layer.

19. The method of claim 18, wherein a dopant of the doped silicon layer is one of boron (B), phosphorus (P), and arsenic (As).

20. The method of claim 19, wherein the doped silicon layer is formed using a source gas containing $SiH_4$ and $PH_3$ when the dopant of the doped silicon layer is phosphorus(P).

21. The method of claim 18, wherein the metal atoms are one of tungsten (W), titanium (Ti), and tantalum (Ta).

22. The method of claim 21, wherein $WF_6$ and $SiH_4$ or $WF_6$ and $SiH_2Cl_2$ are used as source gases for causing the silicide layer to have more tungsten atoms than silicon atoms.

23. The method of claim 21, wherein $TiCl_4$ or $TiI_2$ and $SiH_4$ or $SiH_2Cl_2$ are used as source gases for causing the silicide layer to contain more titanium (Ti) atoms than silicon atoms.

24. The method of claim 21, wherein $TaCl_5$ and $SiH_4$ or $SiH_2Cl_2$ are used as source gases for causing the silicide layer to contain more tantalum (Ta) atoms than silicon atoms.

25. The method of claim 18, wherein the heat treatment is conducted at a temperature in a range of about 400 deg. C.~1100 deg. C.

26. The method of claim 18, wherein the heat treating step converts the silicide layer into a second silicide layer having a tetragonal phase crystal structure.

27. The method of claim 18, wherein the silicide layer is amorphous.

28. The method of claim 27, wherein the silicide layer is formed by depositing the silicide layer at a temperature below 555 deg. C. for making an amorphous silicide layer.

29. The method of claim 18, wherein, in the step of forming a silicide layer on the doped silicon layer, the silicide layer is formed without exposing the doped silicon layer to the atmosphere.

30. The method of claim 18, wherein the doped silicon layer comprises a polysilicon layer.

31. The method of claim 18, wherein the silicide layer containing more metal atoms than silicon atoms is formed such that a ratio of metal atoms (M) to silicon atoms (Si) satisfies a condition of about $0.5 \leq x < 1$ in $MSi_x$.

32. The method of claim 18, wherein the silicide layer has amorphous and crystalline existing therein together.

33. The method of claim 32, wherein the silicide layer is formed by depositing the silicide layer at a temperature above 555 deg. C. for forming the silicide layer containing more metal atoms than silicon atoms and having amorphous and crystalline existing together.

34. The method of claim 18, wherein the doped silicon layer is doped with one of boron (B) and arsenic (As).

35. The method of claim 18, wherein the metal atoms are one of tungsten (W) and tantalum (Ta).

36. The method of claim 18, wherein the heat treatment is conducted at a temperature of about 601 deg. C. to about 1100 deg. C.

37. A method for fabricating a semiconductor device, comprising the steps of:

forming an impurity doped silicon layer on a substrate; and, conducting a chemical vapor deposition process and causing the impurity in the impurity doped silicon layer and a fed source gas to react for forming a silicide layer containing excessive metal on the impurity doped silicon layer wherein the chemical vapor deposition process used to form the silicide layer is conducted after the doped silicon layer is formed, and such that the doped silicon layer is not exposed to the atmosphere before the silicide layer is formed.

38. The method of claim 37, wherein the fed source gas includes a first gas and a second gas, and the silicide layer is formed both by a metal segregation reaction between the first gas and the impurity in the impurity doped silicon layer and by a silicidation reaction between the first, and second gases.

39. The method of claim 37, wherein the impurity in the impurity doped silicon layer is one of phosphorus (P), boron (B), and arsenic (As).

40. The method of claim 37, wherein the first gas is $WF_6$, and the second gas is $SiH_4$ or $SiH_2Cl_2$.

* * * * *